US006985357B2

(12) United States Patent  (10) Patent No.: US 6,985,357 B2
Cauthron  (45) Date of Patent: Jan. 10, 2006

(54) COMPUTING HOUSING FOR BLADE SERVER WITH NETWORK SWITCH

(75) Inventor: David M. Cauthron, Tomball, TX (US)

(73) Assignee: Galactic Computing Corporation BVI/BC, Hong Kong (HK)

( * ) Notice: Subject to any disclaimer, the term of this patent is extended or adjusted under 35 U.S.C. 154(b) by 0 days.

(21) Appl. No.: 10/930,046

(22) Filed: Aug. 30, 2004

(65) Prior Publication Data

US 2005/0157461 A1   Jul. 21, 2005

Related U.S. Application Data

(60) Provisional application No. 60/498,493, filed on Aug. 28, 2003, provisional application No. 60/498,460, filed on Aug. 28, 2003, provisional application No. 60/498,447, filed on Aug. 28, 2003.

(51) Int. Cl.
  *G06F 1/16* (2006.01)

(52) U.S. Cl. .................... 361/683; 361/724; 312/223.1

(58) Field of Classification Search ................ 361/679, 361/683, 686–687, 724–727; 312/223.1–223.3
See application file for complete search history.

(56) References Cited

U.S. PATENT DOCUMENTS

| 6,305,556 | B1 | 10/2001 | Mayer |
| 6,327,139 | B1 | 12/2001 | Champion et al. |
| 6,435,354 | B1 | 8/2002 | Gray et al. |
| 6,452,809 | B1 * | 9/2002 | Jackson et al. ............. 361/796 |
| 6,483,709 | B1 | 11/2002 | Layton |
| 6,816,905 | B1 | 11/2004 | Sheets et al. |
| 2002/0004913 | A1 * | 1/2002 | Fung |

* cited by examiner

*Primary Examiner*—Yean-Hsi Chang
(74) *Attorney, Agent, or Firm*—Patterson, Thuente, Skaar & Christensen, P.A.

(57) ABSTRACT

A multiple blade computer server housing comprises a cabinet having a first side and a second side, at least one chassis positioned within the cabinet that houses a plurality of server blades and a plurality of interface cards, and at least one door panel hingedly mounted to the second side such that access to the second side is gained by opening the door panel. The door panel has mounted thereon at least one network switch card. Generally, the network switch card can be connected by cables to at least a portion of the plurality of interface cards. In another aspect, the invention pertains to a door for a computing blade server housing where the door comprises a door panel, a track system located on at least one side of the door panel, and plurality of interface connectors located along at least one edge of the door panel.

20 Claims, 10 Drawing Sheets

COMPUTING HOUSING FOR BLADE SERVER WITH NETWORK SWITCH

PRIORITY CLAIM

The present application claims priority to U.S. Provisional Application No. 60/498,493 entitled "COMPUTING HOUSING FOR BLADE WITH NETWORK SWITCH," filed Aug. 28, 2003; and U.S. Provisional Application No. 60/498,460 entitled, "iSCSI BOOT DRIVE SYSTEM AND METHOD FOR A SCALEABLE INTERNET ENGINE," filed Aug. 28, 2003; and U.S. Provisional Application No. 60/498,447 entitled "MAINTENANCE UNIT ARCHITECTURE FOR A SCALEABLE INTERNET ENGINE;" filed Aug. 28, 2003, the disclosures of which are hereby incorporated by reference. Additionally, the present application incorporates by reference U.S. patent application Ser. No. 09/710,095 entitled "METHOD AND SYSTEM FOR PROVIDING DYNAMIC HOSTED SERVICE MANAGEMENT ACROSS DISPARATE ACCOUNTS/SITES," filed Nov. 10, 2000.

FIELD OF THE INVENTION

The present invention relates generally to the field of computer server housings. More specifically, the present invention relates to a multiblade computer server housing apparatus having a hinged access panel that carries one or more network switch cards.

BACKGROUND OF THE INVENTION

The explosive growth of the Internet has been driven to a large extent by the emergence of commercial service providers and hosting facilities, such as Internet Service Providers (ISPs), Application Service Providers (ASPs), Independent Software Vendors (ISVs), Enterprise Solution Providers (ESPs), Managed Service Providers (MSPs), and the like. Although there is no clear definition of the precise set of services provided by each of these businesses, generally these service providers and hosting facilities provide services tailored to meet some, most, or all of a customer's needs with respect to application hosting, site development, e-commerce management and server deployment in exchange for payment of setup charges and periodic fees. In the context of server deployment, for example, the fees are customarily based on the particular hardware and software configurations that a customer will specify for hosting the customer's application or website. For purposes of this invention, the term "hosted services" is intended to encompass the various types of these services provided by this spectrum of service providers and hosting facilities. For convenience, this group of service providers and hosting facilities shall be referred to collectively as Hosted Service Providers (HSPs).

Generally, there are two approaches with respect to the way in which HSPs build their server farms. One approach is to use a homogenous group of personal computer systems (hardware and software) supplied from a single manufacturer. The other approach is to use personal computer systems supplied from a number of different manufacturers. The homogenous approach affords the HSP advantages in terms of only having to support a single server platform, but at the same time it restricts the HSP to this single server platform. The heterogeneous approach using systems supplied from different manufacturers is more flexible and affords the HSP the advantage of utilizing the most appropriate server hardware and software platform for a given customer or task, but this flexibility comes at the cost of increased complexity and support challenges associated with maintaining multiple server platforms.

As HSPs increased their capacity, the number of servers in their computer room or data center also increased. To conserve on floor space in the computer room or data center, an HSP would install rack mounted cabinets to allow multiple servers to be stacked together on the same amount of floor space. Individual personal computer servers could then be stacked either vertically or horizontally in these rack mounted cabinets together with switching equipment and modems. As a further improvement on the conventional power packaging enclosure of a typical personal computer server, servers have been developed specifically for rack mounting in what are referred to as "pizza box" or "U" formats where each server slides horizontally into one or more slots in a rack mounted cabinet. Examples of homogenous servers packaged in this type of rack mounted configuration include the RaQ™ server line from Cobalt Network Systems, the Netfinity® sever line from IBM, and the A-class server line from Hewlett-Packard.

Although rack mounted servers offer a considerable improvement in terms of space efficiency as compared to conventional tower cabinet personal computer servers, installing or adding new rack mounted servers to a server farm continues to be a manual operation involving significant amounts of cabling and wire connection, as well as software and network configuration. Additionally, servicing and/or updating rack mount server configurations can involve adding or changing connections to network switch cards and/or replacing cables. As the number of computers, or servers, housed in a particular rack continues to increase, the number or wires and cables necessary to connect the servers to, for example, interface cards and network switch cards also increases. This increase in the number of wires and cables can make servicing and installing new rack hardware more cumbersome and time consuming. Thus, there is a need for rack structures that can adequately accommodate and manage the cables and wires associated with rack mount servers.

Previous rack designs attempted to minimize the wire and cable problems by employing collapsible, or flexible, cable management arms. Examples of these types of devices are disclosed in U.S. Pat. No. 6,327,139 to Champion et al., entitled "Electrical Equipment Rack Having Cable Management Arms with Flexible Linkage;" U.S. Pat. No. 6,305,556 to Mayer, entitled "Cable Management Solution for Rack-Mounted Computers;" and U.S. Pat. No. 6,435,354 to Gray et al., entitled "Cable Management Arm Assembly." Additionally, U.S. Pat. No. 6,483,709 to Layton, entitled "Cable Management Solution for Rack Mounted Computing Components," discloses a backplate that is fixedly coupled to a rack structure, wherein one face of the backplate can connect with the operating cables, such as, I/O devices. However, none of the above-mentioned patents solve all of the problems, such as, for example, cable management, network switch card connection and rack and/or hardware accessibility, typically associated with rack mount servers.

Additionally, U.S. Pat. No. 6,452,809 to Jackson et al., entitled "Scalable Internet Engine," discloses a space efficient cabinet designed to accommodate a large number of commercially available server boards in a blade arrangement. More specifically, the '809 patent discloses an Internet engine in which the server blades are removably positioned in the front side of the cabinet and can connect with interface cards positioned in the back of the cabinet via a through plane. The Internet engine of the '809 patent can accommodate different types of motherboards for each server blade due to a common blade carrier structure. While the '809 patent advantageously allows for different types of commercially available motherboards to be housed and/or interchanged within the same Internet engine in a blade server arrangement, the '809 patent does not address the issues of cable management or network switch card accessibility for a blade server housing.

As the number of personal and business related websites continues to grow, the number of servers and racks employed by HSPs will also expand. Accordingly, there is a need for rack mount servers that address and solve the problems mentioned above.

SUMMARY OF THE INVENTION

The present invention is a multiple blade computer server housing comprising a cabinet having a first side and a second side, at least one chassis positioned within the cabinet that houses a plurality of server blades and a plurality of interface cards, and at least one door panel hingedly mounted to the second side such that access to the second side is gained by opening the door panel. The door panel has mounted thereon at least one network switch card. Generally, the network switch card can be connected by cables to at least a portion of the plurality of interface cards.

In a further aspect, the invention pertains to a method of connecting at least one interface card to at least one network switch card. In one embodiment, the method comprises providing a computing blade server housing including a cabinet with a first side, a second side and a door panel hingedly mounted to the second side, wherein the door panel includes at least one network card mounted thereon. Generally, the computing blade server housing comprises a plurality of server blades and a plurality of interface cards. In one embodiment, the method further comprises sliding a plurality of server blades into the first side to hold and interconnect the plurality of server blades, sliding a plurality of interface cards into the second side to hold and interconnect the plurality of interface cards, and connecting at least one network switch card mounted on the door panel to at least a portion of the plurality of interface cards.

In another aspect, the invention pertains to a door for a computing blade server housing. In these embodiments, the door comprises a door panel, a track system located on at least one side of the door panel, and plurality of interface connectors located along at least one edge of the door panel. In one embodiment, the track system comprises a structure adapted to slidably engage and disengage a corresponding structure on a network switch card. In some embodiments, the interface connectors can operably connect with a plurality of connector elements located on a network switch card.

DETAILED DESCRIPTION OF THE PREFERRED EMBODIMENTS

An improved computing blade server housing comprises a cabinet having a first side and a second side. In one embodiment, the cabinet includes at least one chassis positioned within the cabinet that houses a plurality of server blades and a plurality of interface cards. In one embodiment, at least one door panel can be hingedly mounted to the second side. Generally, the door panel includes at least one network switch card mounted thereon. Due to the presence of the hingedly mounted door panel and the network switch card mounted thereon, the computing blade server housing provides a structure that can both manage the cables and wires necessary for connecting the servers to network switch cards and also provides access to the second side of the cabinet for maintenance and servicing procedures. The computing blade server housing further comprises structure in the chassis adapted to hold and interconnect the plurality of server blades inserted from the first side and structure adapted to hold and interconnect the plurality of interface cards inserted form the second side. In some embodiments, a plurality of door panels are hingedly mounted to the second side, and each of the plurality of door panel can include at least one network switch card mounted thereon.

Figure 1:
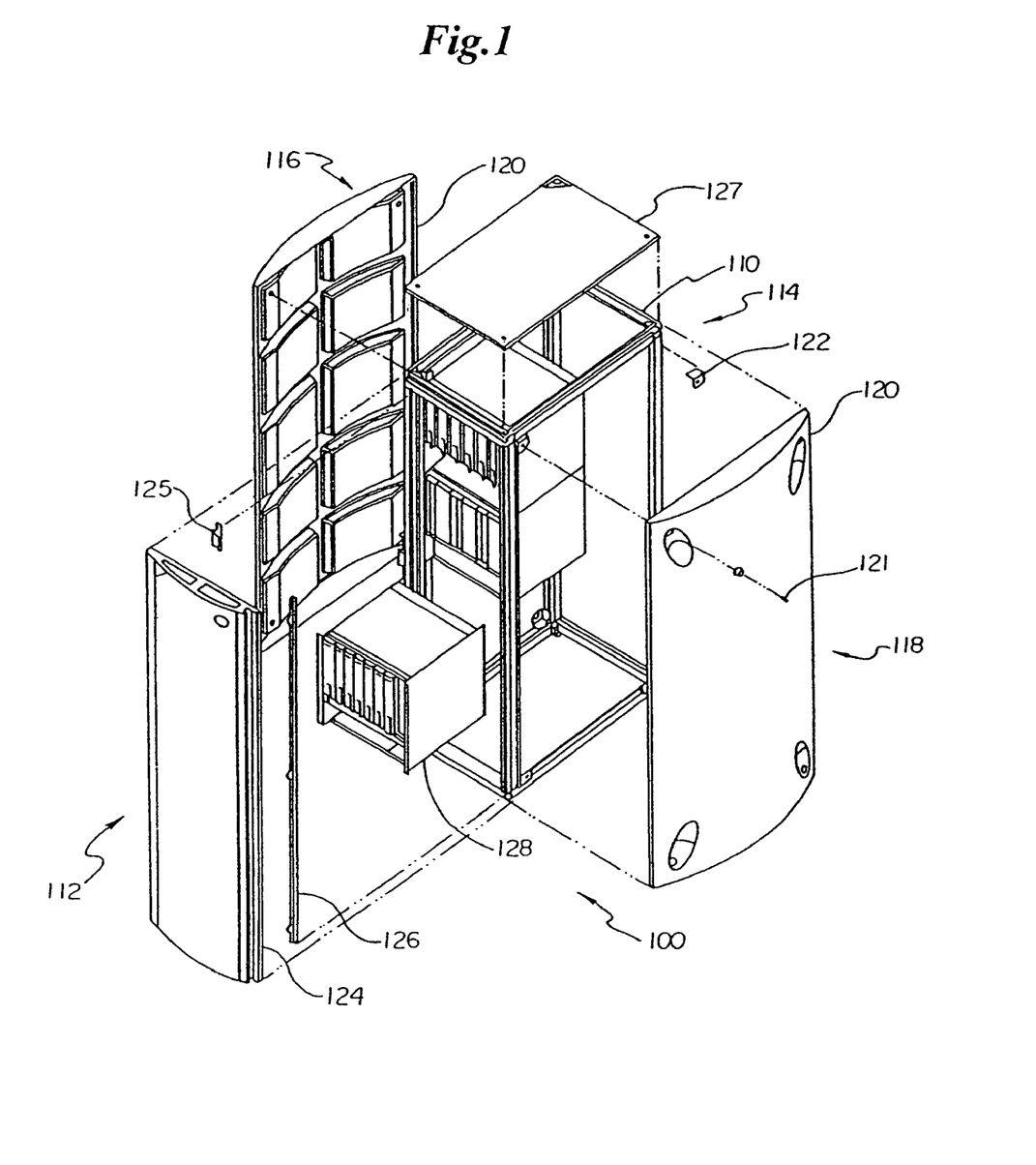
FIG. 1 is an exploded perspective view of an embodiment of a computing blade server housing.

Referring to FIG. 1, an overview of one embodiment of a computing blade sever housing is shown. In one embodiment, computing blade server housing comprises a cabinet 110 including a first side 112, a second side 114 and side members 116, 118. In some embodiments, side members 116, 118 can have a corresponding side panel or skin 120 rigidly mounted to the cabinet 110 by, for example, screws, bolts or similar fastening mechanisms 121 that can connect to a bracket 122 in each corner of cabinet 110. Alternatively, side panels 120 can be welded on to cabinet 110 so as to form an integral assembly. In a multi cabinet embodiment, one or both of the side panels 120 may be absent depending upon the portion of cabinet 110 within an overall side-by-side arrangement. Generally, first side 112 can be provided with first door panel 124 attached to first side 112 by hinges 125. In some embodiments, as will be described below, second side 114 can be provided with at least one door panel 400 (FIGS. 5 and 6) hingedly coupled to second side 114 that provides access to second side 114. First door panel 124 can be latched, and in some embodiments locked, to cabinet 110 by a latch bar 126. Alternatively, other forms of attaching and securing fist door panel 124 to first side 112 can be utilized, such as, for example, sliding attachment, hanging attachment, or removable attachment. Optionally, a panel 127 may be installed on either or both of the top and bottom of cabinet 110, depending upon the structural, cooling and electrical isolation requirements. In one embodiment, cabinet 110 can be a 19" NEBS compliant metal rack that is 19" wide, 100 mm deep and up to 84" tall. In one embodiment, cabinet 110 can be composed of metal, but other materials such as, for example, rigid plastics, fiberglass, or combinations of metal and plastics are possible. Side panels 120 and first door panel 124 may be composed of metal, fiberglass or plastic depending upon weight, cost and electrical isolation considerations. Unlike most rack mounted cabinets for existing personal computer servers, the NEBS compliant cabinet of the present disclosure meets applicable NEBS standards for airflow, dust, shock and vibration limits for cabinetry housing electrical equipment.

Figure 2:
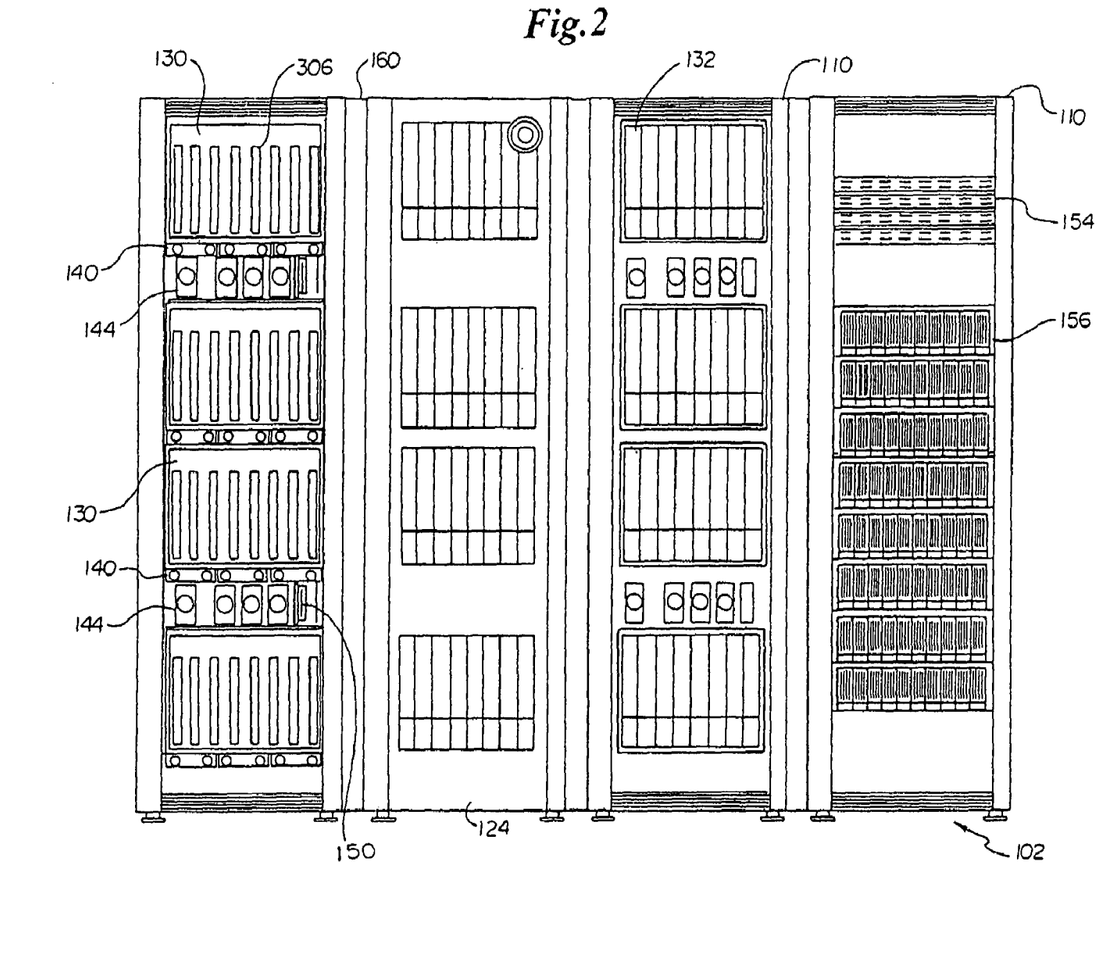
FIG. 2 is a front view of another embodiment of a computing blade server housing with four cabinets in a side-by-side arrangement.
Figure 3:
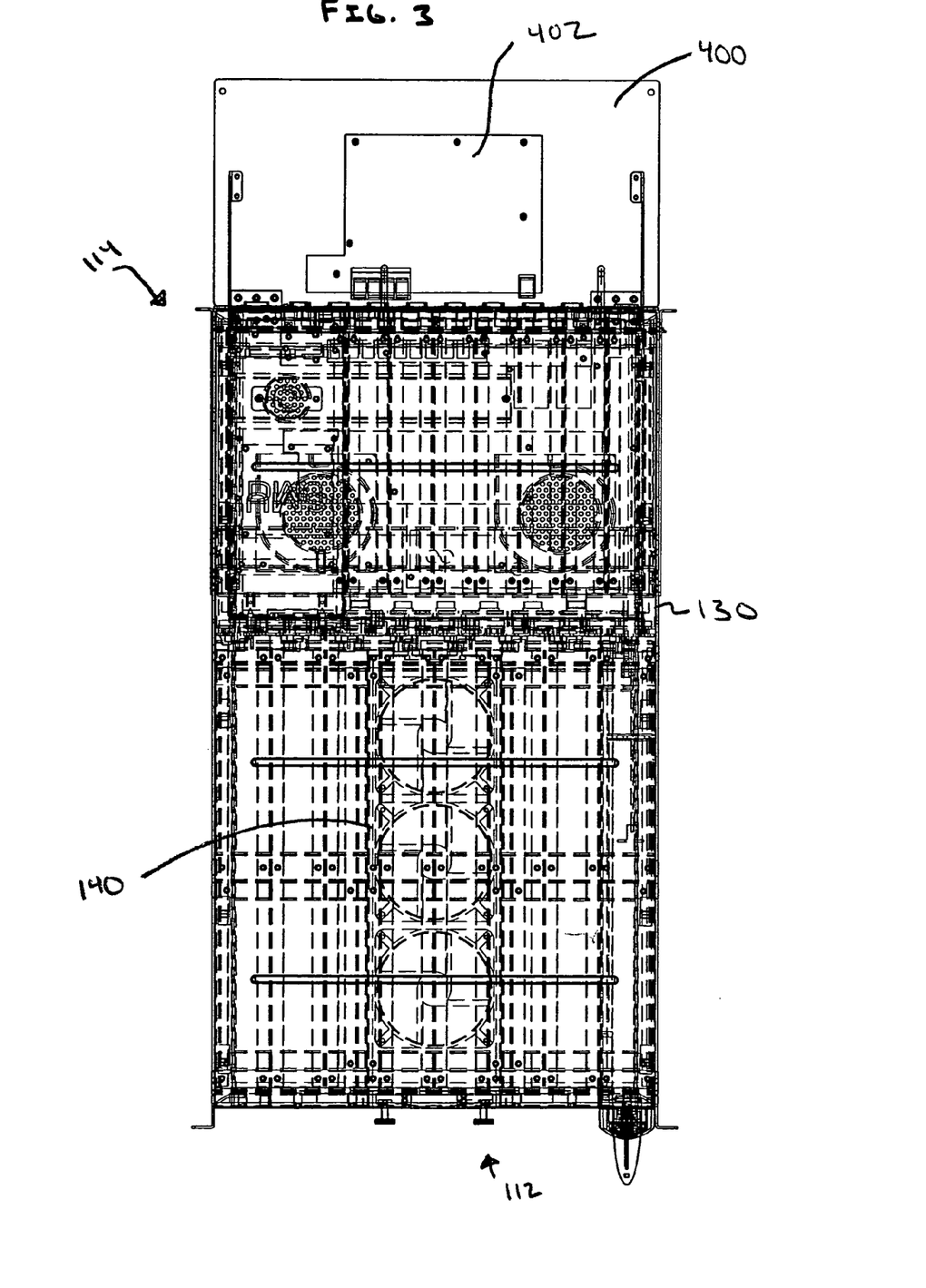
FIG. 3 is a top view section view of a chassis assembly for a computing blade server housing.

Referring to FIGS. 1–3, a through plane 130 separates first side 112 from second side 114 in that portion of cabinet 110 that houses a plurality of server blades 132 and a plurality of interface cards 134. Generally, each server blade 132 contains at least one processor unit and each interface card 134 manages at least one input/output (I/O) communication channel for the associated processor with either disk storage (e.g., an array of SCSI disks, a Storage Array Network (SAN) unit or a Fibre Channel (FC) disk array) or communication switches (e.g., FC switches, ATM switches, Ethernet switches or modems). Front door panel 124 allows access to server blades 132 from the first side 112, while door panel(s) 400 (FIGS. 5 and 6), described below, allow access to, for example, interface cards 134 from second side 114. Cabling for interconnecting interface cards 134 with associated disk storage or communication switch equipment is conveniently accessible from second side 114 without the need for disturbing the server blades 132 on the first side 112. Similarly, server blades 132 can be replaced without any need for disconnecting or otherwise disturbing interface cards 134 or the cabling connected to those cards.

In one embodiment, as shown best in FIG. 2, two separate chassis assemblies 128 can be arranged in a stacked fashion within a single cabinet 110, with each chassis assembly 128 providing space for up to sixteen (16) server blades 132. In this embodiment, each chassis assembly 128 includes two sub-chassis 129 arranged one on top of the other and each providing space for up to eight (8) server blades per sub-chassis 129. A power frame 144, as will be described, can be mounted below the pair of sub-chassis 129 to form the completed chassis assembly 128. In embodiments having two chassis assemblies 128, a total of thirty-two server blades 132 may be housed in a single cabinet 110. One of ordinary skill in the art will recognize that additional configurations and orientations of sub-chassis 129, and the number of server blades 132 per sub-chassis 129, are contemplated and are within the present disclosure. In some embodiments, server blades 132 are positioned vertically within each sub-chassis 129. In further embodiments, additional components can optionally be housed within cabinet 110.

A shown in FIGS. 2 and 3, a plurality of fan trays 140 can be removably mounted on the bottom of each chassis assembly 128 to cool server blades 132 in that chassis assembly 128. Fan trays suitable for use in computer server applications are disclosed generally in, for example, U.S. Pat. No. 6,452,809 to Jackson et al., entitled "Scalable Internet Engine," which is hereby incorporated by reference.

Figures 4, 5:
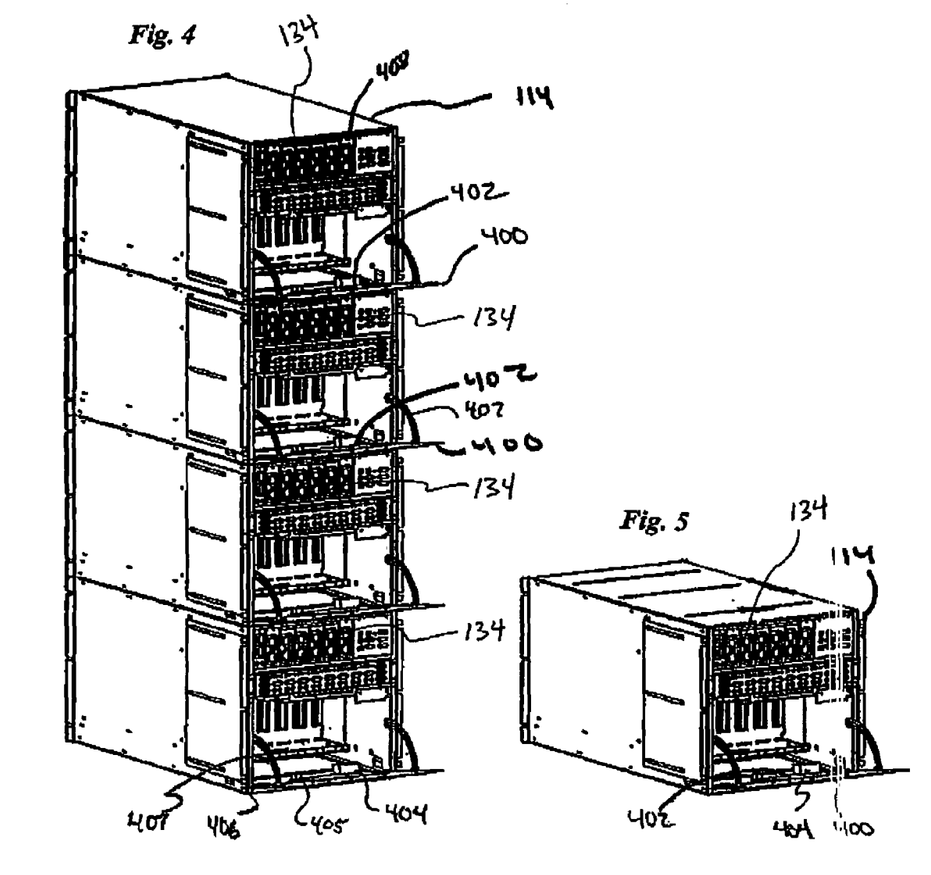
FIGS. 4 and 5 are perspective views of an embodiment of a computing blade server housing with door panels hingedly mounted to the second side of the cabinet.

Referring to FIGS. 4 and 5 in one embodiment, second side 114 can have at least one door panel 400 hingedly connected to second side 114 such that access to second side 114 can be gained by opening door panel 400. In some embodiments, door panel 400 opens in a downward arch. A person of ordinary skill in the art will recognize that additional configurations of door panel 400, that allow door panel 400 to open in other directions, are contemplated and are within the present disclosure. Generally, at least one network switch card 402 can be mounted onto door panel 400, and network switch card 402 can comprise connection structures 404 for operably connecting to at least a portion of interface cards 134. In some embodiments, door panel 400 can be attached to second side by a hinge member 406. Hinge member 406 can be any mechanical structure, such as, for example, a hinge rod or a pivot structure, that can operably and rotationally couple door panel 400 to second side 114. In some embodiments, the door panel 400 is hingedly mounted to second side 114 such that an aperture or slot can be defined between door panel 400 and second side 114 for routing cables and connectors behind. Preferably, this slot is created substantially parallel to the axis or rotation of door panel 400. Hinge guide 407 is preferably used to assist in supporting and tracking door panel 400 as it opens and closes.

Referring to FIGS. 11–14, another embodiment is shown where door panel 400 comprises a switch module housing 600 mounted to door panel 400. In one embodiment, switch module housing 600 can hold four 12 port switch modules 602. In other embodiments, switch module housing 600 can hold a plurality of 12 port switch modules, and no particular number of 12 port switch modules is required by the present disclosure. Generally, each switch module 602 can use a high density Compact-PCI style connector 603 which can be divided into fixed RJ-45 gigabit Ethernet ports. In one embodiment, connector 603 comprises 32 server ports which can connect to the sever blades and 16 external ports which can provide connection outside of the second side 114 when door 400 is closed. Additionally, 8 small form-factor pluggable (SFP) sockets 604 can be provided to host fiber-optic modules. This arrangement allows for the hot swapping of switching modules 602 without the need to re-cable the blades or chassis networking connections.

In the embodiment shown in FIGS. 4 and 5, connector 404 includes multiple data cable connectors and an additional connector 405 provides power and ground signals to the network switch card 402. As shown, door panel 400 does not cover the entire exposed area of second side 114 in one embodiment, thereby allowing for selective cable and power access without the need to open door 400. In one embodiment, door panel 400 can be composed of metal, while in other embodiments door panel can be composed of plastics, fiberglass or combinations thereof. The selection of a particular material for door panel 400 will generally be guided by the intended application of a specific server housing apparatus.

Referring to FIG. 4, in some embodiments, a plurality of door panels 400 can be hingedly mounted to second side 114 to provide access to second side 114. In one embodiment, each sub-chassis 129 can have a corresponding door panel 400 hingedly mounted to second side 114 that provides access to the rear portion of each sub-chassis 129. In some embodiments, the plurality of door panels 400 can all open in a downward arch, however, no particular configuration of door panels is required by the present disclosure. In one embodiment, as shown in FIG. 4, each of the plurality of door panels 400 includes at least one network switch card 402 mounted thereon, and each network switch card comprises connection structures 404 that permit each network switch card 402 to operably couple with at least a portion of the plurality of interface cards 134. In some embodiments, the plurality of door panels are hingedly mounted to second side 114 such that a plurality of apertures 408 can be defined between the plurality of door panels 400 and second side 114. In one embodiment, the plurality of apertures 408 can be defined by spaces between the door panels 400 and second side 114 that are substantially parallel to the axis of rotation of each of the plurality of door panels 400.

Referring to FIGS. 4 and 5, a plurality of cables (not shown) can operably connect at least a portion of interface cards 134 to at least one network switch card 402 mounted on at least one door panel 400. In one embodiment, the plurality of cables connect a portion of interface cards 134 to at least one network switch card 402 through aperture 408. In this embodiment, when door panel 400 is opened, the cables can be located underneath the inside surface of door panel 400. Due to the plurality of cables being located underneath the inside surface of door panel 400 when door panel 400 is in the open position, a person may perform maintenance or servicing inside the second side 114 of cabinet 110 without the interference of the cables.

Figure 6:
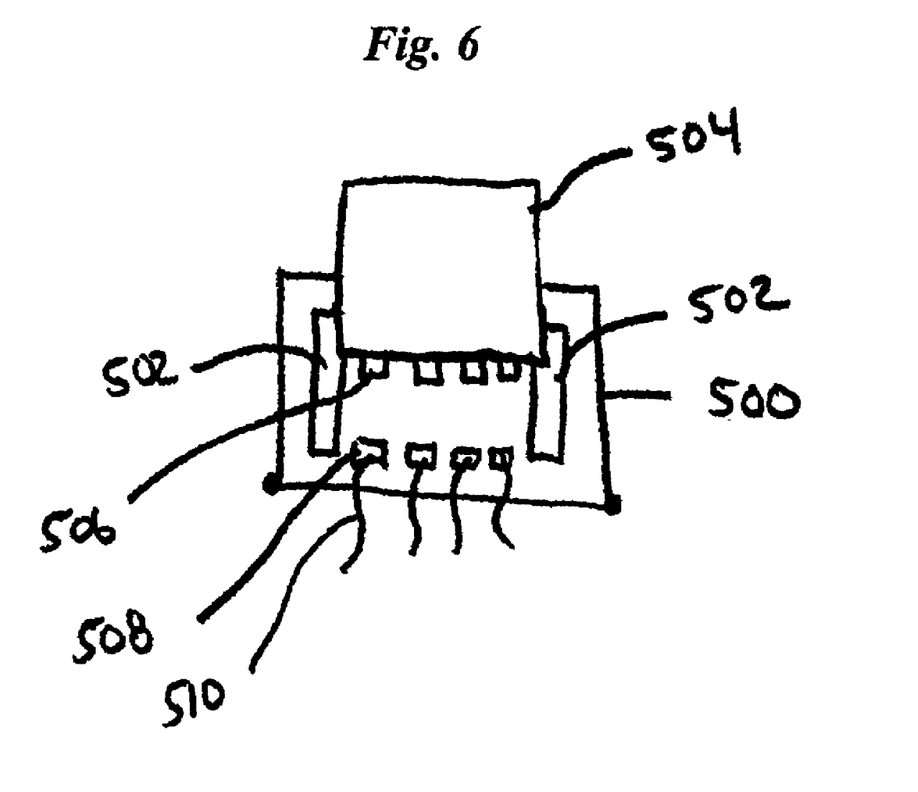
FIG. 6 is a top view of a door panel with a track system which can operably couple and uncouple to a network switch card.

Referring to FIG. 6, in another embodiment, hingedly mounted door panel 500 can comprise a track system 502. Track system 502 is configured to adapt with corresponding structure on network switch card 504, which allows network switch card 502 to be coupled and uncoupled from door panel 500. In some embodiments, network switch card 504 comprises a plurality of connectors 506 along at least one edge of network switch card 504, which can operably couple with a plurality of interface structures 508 located on door panel 500. Interface structures 508 can be provided with a plurality of cables 510, which can connect interface structures 508 to at least a portion of interface cards 134. Thus, in this embodiment, network switch card 504 can be easily be accessed and/or replaced without disconnecting a plurality of cables and wires.

Figures 7, 8:
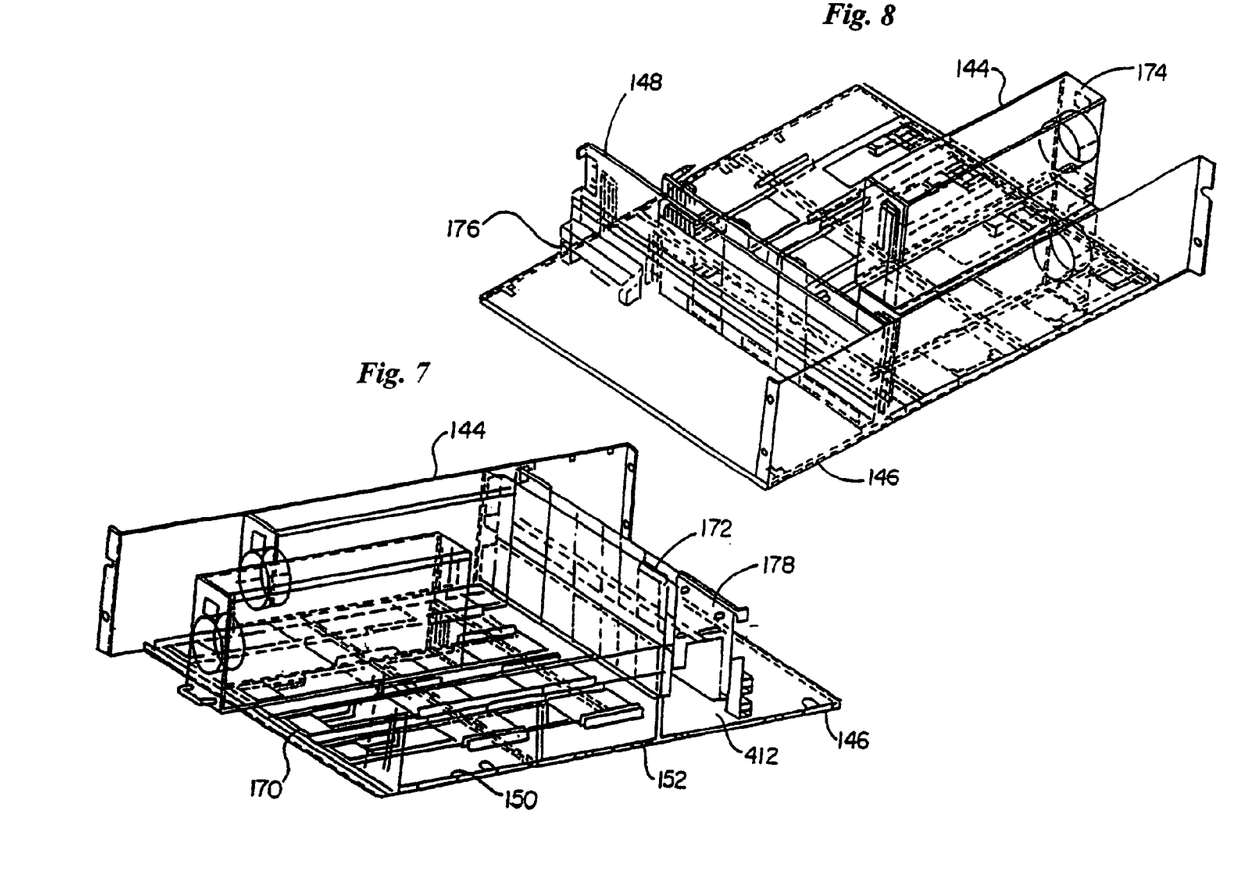
FIGS. 7 and 8 are front and rear cut away perspective views of the redundant power supplies.

Referring to FIGS. 7 and 8, a plurality of power supplies 144 can be removably housed in frame 146 that can be mounted in chassis assembly 128 separately from sub-chassis 129. Power frame 146 includes an AC/DC board 148 that coordinates power supplied from power supplies 144 and routes this power to through plane 130. In one embodiment, at least three (3) removable power supplies 144 can be installed in power frame 146, even though only two (2) would be required to power a fully populated cabinet 110. This feature provides for redundancy in the event of a failure of any one of the power supplies 144.

In one embodiment, up to four (4) power supplies 144 can be slidably mounted on power frame 146 via tracks 170. In some embodiments, power supplies 144 are high efficiency 400 watt multiple power output power supplies, such as, for example, the HP3 available from Magnetec®. Connectors 172 on the front side of AC/DC board 148 can attach to connectors 174 on the rear of the power supplies to allow the power supplies to be hot swappable. In some embodiments, standard peripheral connectors 176 for plug-in CD drives or hard drives can be provided on the front side portion 178 of AC/DC board 148. A set of shared peripheral connections 179 can also be mounted on the rear of AC/DC board 148. In some embodiments, electronic quick switches can be used to isolate the peripherals from each server blade 132 and connect them to one server blade 132 at a time when a select button is pressed for that blade.

In one embodiment, AC/DC board 148 also includes connections for common peripheral devices, such as, for example, a CD drive 150 and/or a boot disk drive 152. External connections for other common peripheral devices, such as a common control console having a keyboard, mouse and display (not shown) can also be provided, either on AC/DC board 148 or through plane 130.

Figure 9:
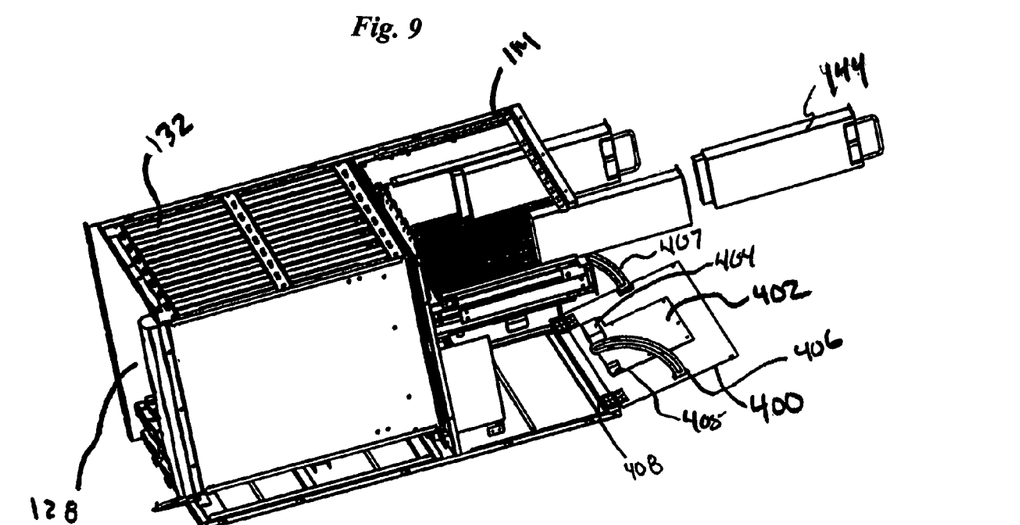
FIGS. 9 and 10 are perspective cut away views of a computing blade server housing with door panels hingedly mounted to the second side of the cabinet.
Figure 10:
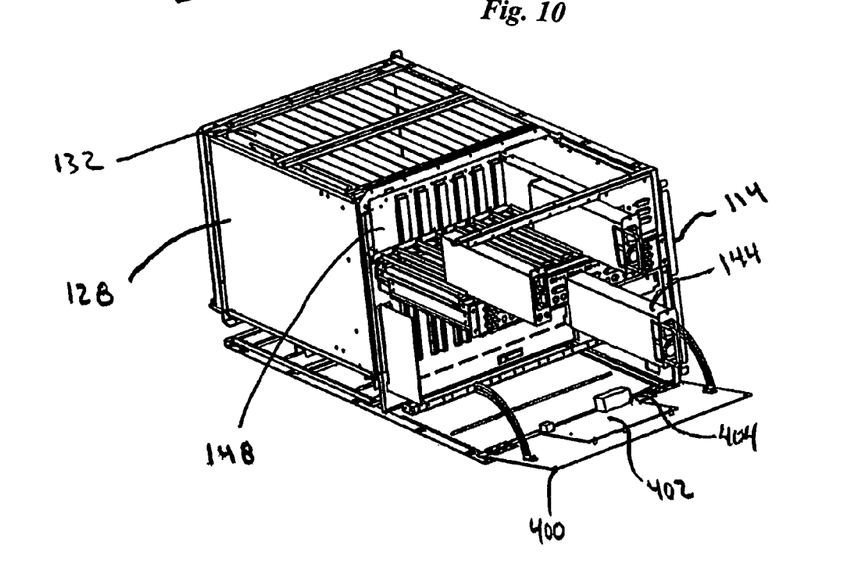
Figure 11:
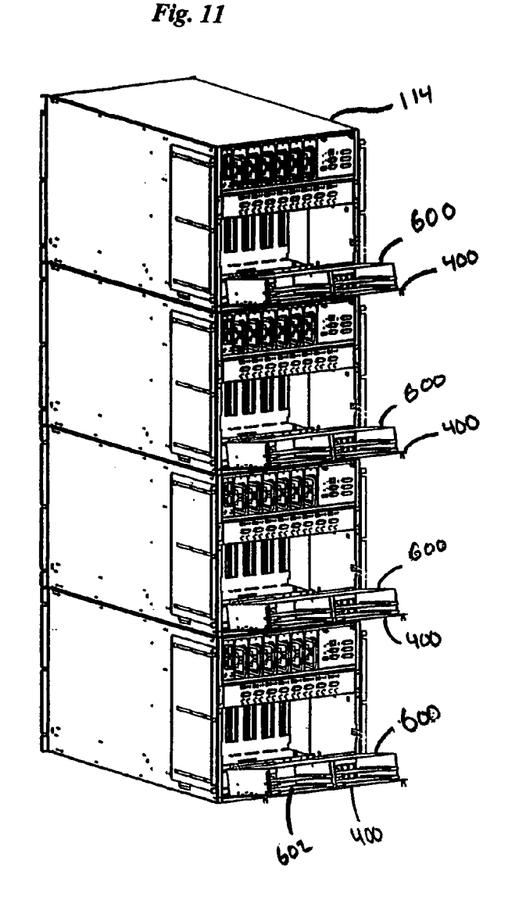
FIGS. 11–14 are perspective views of an embodiment of a computing blade server housing with door panels comprising a switch module housing hingedly mounted to the second side of the cabinet.
Figure 12:
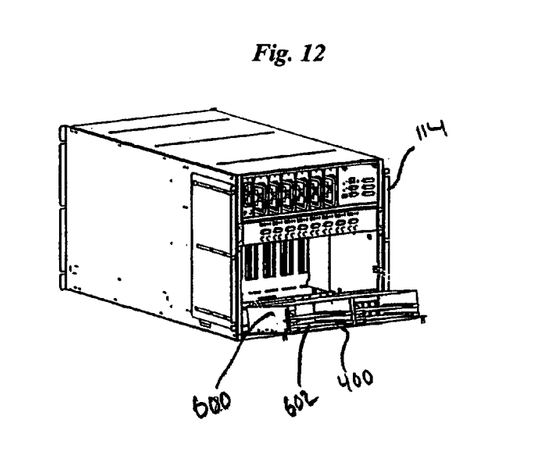
Figure 13:
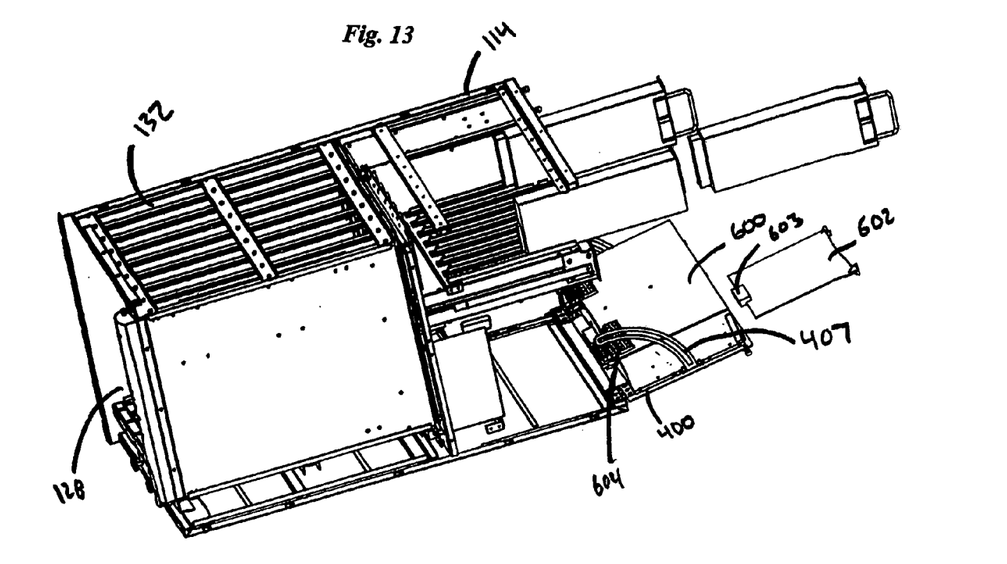
Figure 14:
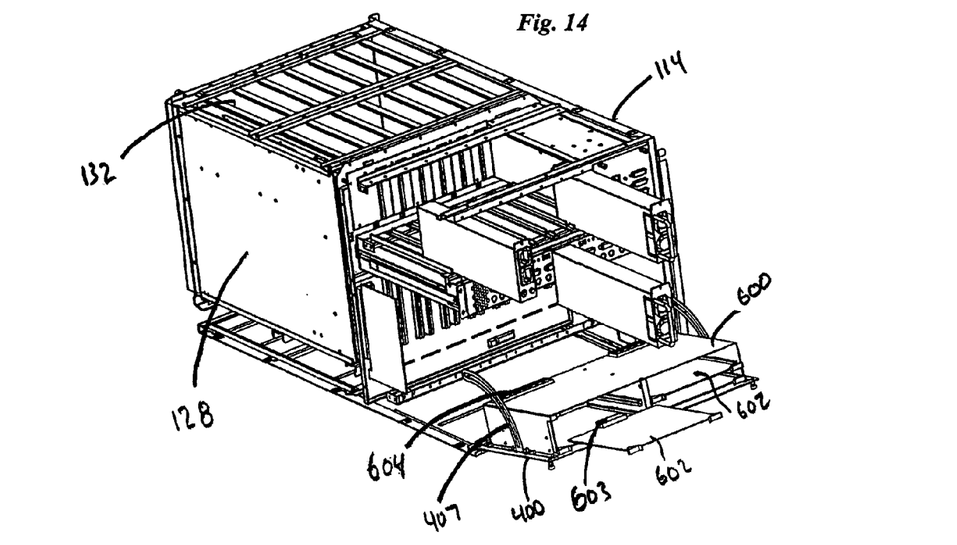
Figure 15:
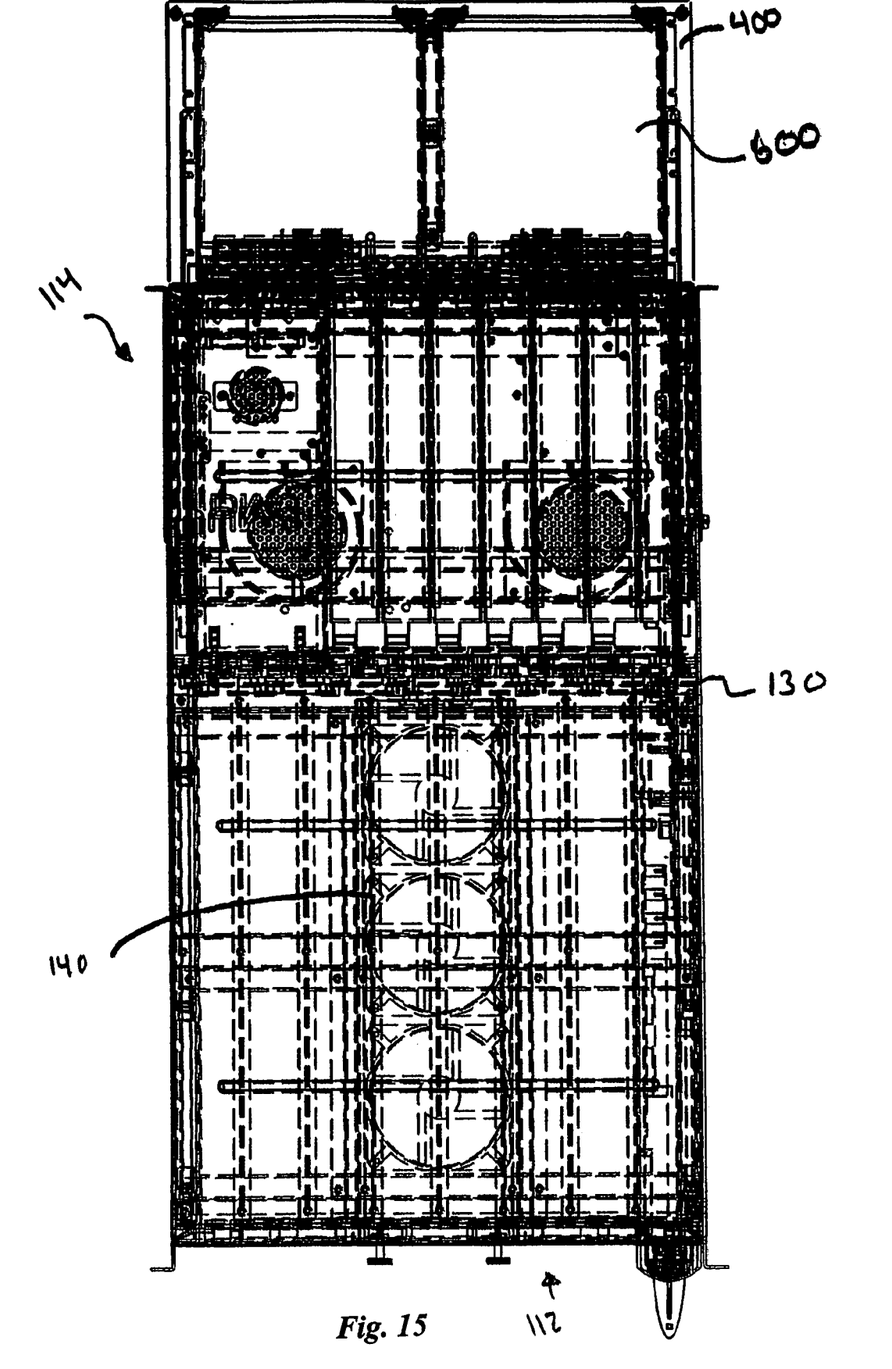
FIG. 15 is a top view section view of a chassis assembly for a computer blade server housing showing a hingedly mounted door panel comprising a switch module housing.

In some embodiments as described above, door panel 400 does not cover the entire exposed area of second side 114. Referring to FIGS. 9 and 10, in one embodiment, door panel 400 does not cover the plurality of power supplies located in second side 114 of cabinet 110, which permits power supplies 114 to be accessed and/or swapped with door panel(s) 400 in either the open position or the closed position.

Referring to FIG. 2, in one embodiment, each chassis assembly 128, including two sub-chassis 129, a power frame 146, and a row of fan trays 140, can be approximately 37" high. In other embodiments adapted to accommodate quad processor servers, chassis assembly 128 can be approximately 40" high. In further embodiments, as shown in FIG. 1, each chassis assembly 128 can hold up to eight (8) server blades 132 in a single sub-chassis 129, with space at the bottom of each sub-chassis 129 for fan trays 140 and power frame 146.

It will be understood that numerous configurations of components within rack mounted cabinet 110 can be accomplished and that other types of peripheral components, such as alternative kinds of storage devices, different kinds of switching equipment, modems or the like, and different common peripherals like floppy disks or tape drives, may be housed within chassis 110 as long as such components support rack mounting, either directly or with the use of a sub frame.

In general, the server blades of the preferred embodiment include a motherboard mounted in a common blade carrier structure that provides a uniform mechanical interface to the server housing, although any type of server blades could be used. The common blade carrier structure is arranged to accommodate a planar surface of a motherboard in a generally vertical orientation and is sufficiently oversized to accommodate the largest motherboard with additional space reserved towards the front of the blade carrier structure to accommodate an internal hard drive or other local peripheral device. Preferably, each motherboard is a commercially available motherboard that includes at least one PCI connector. For further information on engine blade configuration and assembly, the reader is referred to above-mentioned U.S. Pat. No. 6,452,809, which is hereby incorporated by reference.

One of ordinary skill in the art will recognize that while the computer sever apparatus of the present disclosure has been described with reference to one cabinet 110, embodiments are possible where two or more cabinets 110 are combined together to form a scalable engine. Scalable Internet engines are generally described in above-referenced U.S. Pat. No. 6,452,809, which is hereby incorporated by reference. The embodiments above are intended to be illustrative and not limiting. Additional embodiments are within the claims. Although the present invention has been described with reference to particular embodiments, workers skilled in the art will recognize that changes may be made in form and detail without departing form the spirit and scope of the invention.

What is claimed:

1. A computing server apparatus comprising:
   a cabinet having a first side and a second side;
   at least one chassis positioned within the cabinet that houses a plurality of server blades and a plurality of interface cards, the chassis including structure adapted to hold and interconnect the plurality of server blades inserted from the first side and structure adapted to hold and interconnect the plurality of interface cards inserted from the second side; and at least one door panel hingedly mounted to the second side, the door panel having mounted thereon at least one network switch card, the network switch card being connected by cables to at least a portion of the plurality of interface cards, such that access to the second side is gained by opening the at least one door panel.

2. The apparatus of claim 1, wherein each of the plurality of server blades has a first connector and a second connector operably positioned along a rear edge of the server blade.

3. The apparatus of claim 2, wherein the structure adapted to hold and interconnect the plurality of server blades inserted from the first side and the structure adapted to hold and interconnect the plurality of interface cards inserted from the second side comprises a through plane mounted in the cabinet between the first side and the second side, the through plane including a plurality of through plane connectors each adapted for mating with the first connector of one of the plurality of server blades, and a plurality of apertures each defined in the through plane corresponding to one of the through plane connectors and through which the second connector for the corresponding one of the plurality of server blades is accessible.

4. The apparatus of claim 3, wherein the plurality of interface cards each comprise interface card connectors adapted for mating with at least a portion of the second connector of one of the plurality of server blades via a corresponding one of the plurality of apertures in the through plane.

5. The apparatus of claim 1, wherein each of the plurality of server blades includes a motherboard, and wherein each of the plurality of server blades is removably positioned in the first side of the cabinet with a planar surface of the motherboard in a generally vertical orientation.

6. The apparatus of claim 5, wherein each motherboard is mounted in a common server blade carrier structure that provides a uniform mechanical interface to the cabinet such that the cabinet can accommodate different types of motherboards in the same cabinet.

7. The apparatus of claim 1, wherein each of the plurality of interface cards are removably positioned in the second side of the cabinet with a planar surface of the interface cards in a generally vertical orientation.

8. The apparatus of claim 1, wherein there is a plurality of door panels hingedly mounted to the second side.

9. The apparatus of claim 8, wherein an axis of each hinge that hingedly connects the plurality of door panels to the second side are horizontal and are positioned such that the plurality of door panels open in a downward arc.

10. The apparatus of claim 9, wherein the plurality of door panels are hingedly mounted to the second side such that apertures are defined between the plurality door panels and the second side parallel to the axis of rotation of each of the plurality of doors.

11. The apparatus of claim 10, further comprising a plurality of cables routed through the aperture that connect at least a portion of the plurality of interface cards to at least one network switch card.

12. The apparatus of claim 1, wherein the dimensions of the plurality server blades is different than the dimensions of the plurality of interface cards.

13. The apparatus of claim 1, wherein at least one of the plurality of server blades is operably connected to at least two interface cards.

14. A method of connecting at least one interface card to at least one network switch card, the method comprising:
providing a computer server apparatus including a cabinet having a first side and a second side, at least one chassis positioned within the cabinet that houses a plurality of server blades and a plurality of interface cards, and at least one door panel hingedly mounted to the second side, the door panel having mounted thereon at least one network switch card;
sliding a plurality of server blades into the first side to hold and interconnect the plurality of server blades;
sliding a plurality of interface cards into the second side to hold an interconnect the plurality of interface cards; and
connecting the at least one network switch card mounted on the door panel to at least a portion of the plurality of interface cards.

15. A door for a computer server apparatus, wherein the door can be hingedly mounted to the computer server apparatus, the door comprising:
a door panel;
a network switch card comprising a plurality of connector elements;
a track system located on one side of the door panel with a structure adapted to slidably engage and disengage a corresponding structure on the network switch card; and
a plurality of interface connectors located along at least one edge of the door panel, wherein the interface connectors can operably connect with the plurality of connector elements located on the network switch card.

16. The door of claim 15, further comprising a plurality of cables operably connected to the plurality of interface connectors, wherein the cables operably connect the plurality of interface connectors with a plurality of interface cards.

17. The door of claim 15, wherein the plurality of interface connectors can operably connect to the plurality of connector elements when the corresponding structure on the network switch card is slidably engaged with the track system on the door panel.

18. A computing server apparatus comprising:
a cabinet having a first side and a second side;
at least one chassis positioned within the cabinet that houses a plurality of server blades and a plurality of interface cards, the chassis including structure adapted to hold and interconnect the plurality of server blades inserted from the first side and structure adapted to hold and interconnect the plurality of interface cards inserted from the second side; and
at least one door panel hingedly mounted to the second side, the door panel having mounted thereon at least one communication module,
such that access to the second side is gained by opening the at least one door panel.

19. The apparatus of claim 18, wherein the communication module comprises a 12 port switch module including a connector which can be connected by cables to a portion of the server blades.

20. The apparatus of claim 19, wherein the 12 port switch module is located in a switch module housing which is mounted on the door panel.

* * * * *